US012608568B1

(12) United States Patent
    Rothschild

(10) Patent No.: US 12,608,568 B1
(45) Date of Patent: Apr. 21, 2026

(54) METHOD AND A SYSTEM FOR ADAPTIVE GENERATION OF CONVERSATIONAL CONTENT

(71) Applicant: Leigh M. Rothschild, Miami, FL (US)

(72) Inventor: Leigh M. Rothschild, Miami, FL (US)

(73) Assignee: Fronteir Tracking Systems, LLC, Cheyenne, WY (US)

( * ) Notice: Subject to any disclaimer, the term of this patent is extended or adjusted under 35 U.S.C. 154(b) by 0 days.

(21) Appl. No.: 19/008,536

(22) Filed: Jan. 2, 2025

(51) Int. Cl.
    | | |
    |---|---|
    | *G10L 15/22* | (2006.01) |
    | *G06F 16/334* | (2025.01) |
    | *G06F 30/27* | (2020.01) |
    | *G06F 40/58* | (2020.01) |
    | *G10L 15/18* | (2013.01) |

(52) U.S. Cl.
    CPC .......... *G06F 40/58* (2020.01); *G06F 16/3344* (2019.01); *G06F 30/27* (2020.01)

(58) Field of Classification Search
    CPC ................................ G10L 15/22; H04L 51/02
    See application file for complete search history.

(56) References Cited

U.S. PATENT DOCUMENTS

| | | | |
|---|---|---|---|
| 10,621,978 | B2 | 4/2020 | Zamora Duran et al. |
| 11,526,720 | B2 | 12/2022 | Yonekura |
| 11,658,928 | B2 | 5/2023 | Choe |
| 2018/0174055 | A1 | 6/2018 | Tirumale et al. |
| 2018/0293483 | A1 | 10/2018 | Abramson et al. |
| 2023/0105564 | A1* | 4/2023 | Breitweiser ............. H04L 51/04 |
| | | | 705/312 |

| | | | |
|---|---|---|---|
| 2023/0244900 | A1 | 8/2023 | Fidaleo et al. |
| 2024/0161372 | A1* | 5/2024 | Jang ...................... G10L 13/047 |
| 2025/0111244 | A1* | 4/2025 | Ben-Itzhak ............ G06N 3/092 |

OTHER PUBLICATIONS

Van der Vorst, Rens, and Jo-An M. Kamp. "12. Designing a griefbot-for-good." Moral design and technology. Wageningen Academic, 2022. 215-241. (Year: 2022).*
Liu, "Chatbots that replicate the dead and provide grief support"; [online], https://www.gingerliu.com/chatbots-that-replicate-the-dead-and-provide-grief-support/; 2023. (Year: 2023).*
Le, Tam-Tri, and Ruining Jin. "The beginning of Cyber-necromancy: Replacing deceased loved ones with AI agents." Feb. 2, 2024, (Year: 2024).*

* cited by examiner

*Primary Examiner* — Jialong He
(74) *Attorney, Agent, or Firm* — Dobbin IP Law, P.C.

(57) ABSTRACT

A method for adaptive generation of conversational content is disclosed. The method comprises receiving data associated with a first user from a plurality of sources. The data is provided by an input user who is a living person associated with the first user or may be first user themselves. The method comprises creating a personalized profile associated with the first user based on received data. The method comprises generating conversational content in real-time to enable interaction between query users and a trained conversation simulator. The method comprises providing conversational content to query users during an interaction with the trained conversation simulator. During the interaction, query users provides input queries. The method comprises dynamically adapting conversational content based on real-time feedback from query user and interaction patterns within the interaction. In an embodiment, dynamically adapted conversational content is personalized and provides an engaging interaction experience.

16 Claims, 4 Drawing Sheets

Application server 104

Real Time
Interaction Unit 216

Processor 202

Feedback Analysis
Unit 218

Memory 204

Predictive Modeling
Unit 220

Transceiver 206

Customization Unit
222

Input/ Output (I/O)
unit 208

Training Unit 224

Data Collection Unit
210

Payment Unit 226

Profile Creation
Unit 212

Multi Modal
Interaction Unit 228

Conversation
Simulator Unit 214

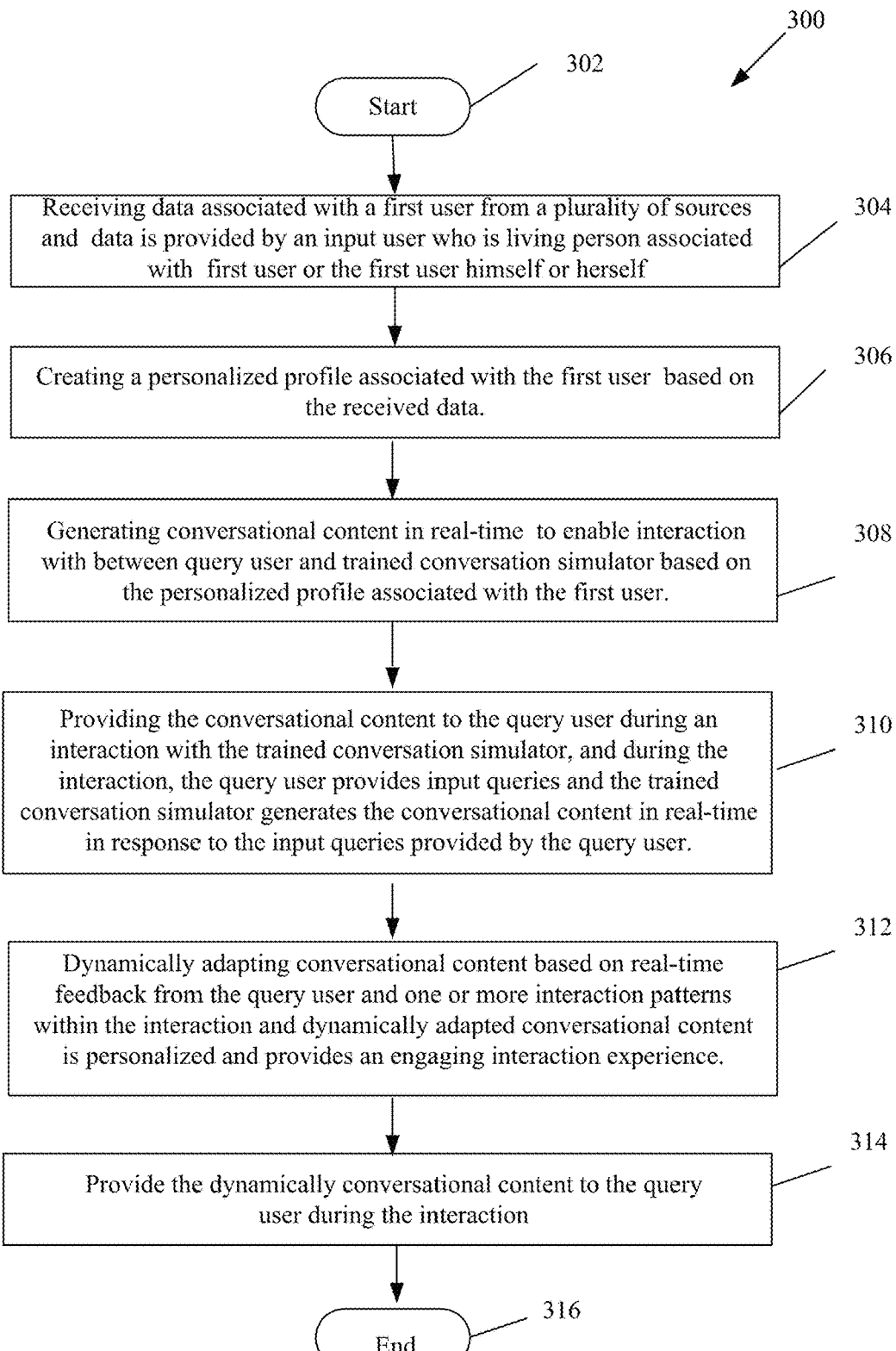

300

302

Start

Receiving data associated with a first user from a plurality of sources and data is provided by an input user who is living person associated with first user or the first user himself or herself

304

Creating a personalized profile associated with the first user based on the received data.

306

Generating conversational content in real-time to enable interaction with between query user and trained conversation simulator based on the personalized profile associated with the first user.

308

Providing the conversational content to the query user during an interaction with the trained conversation simulator, and during the interaction, the query user provides input queries and the trained conversation simulator generates the conversational content in real-time in response to the input queries provided by the query user.

310

Dynamically adapting conversational content based on real-time feedback from the query user and one or more interaction patterns within the interaction and dynamically adapted conversational content is personalized and provides an engaging interaction experience.

312

Provide the dynamically conversational content to the query user during the interaction

314

End

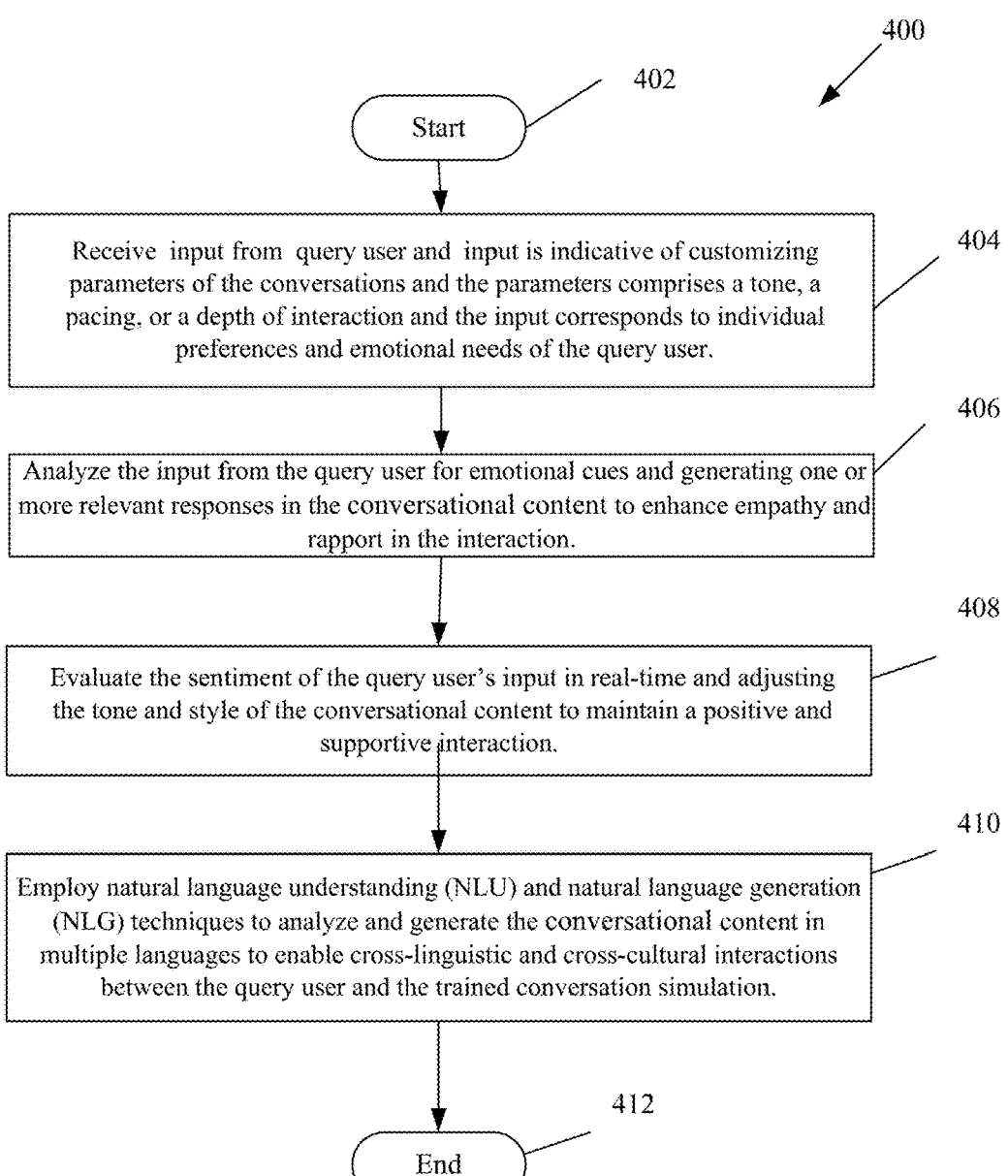

400

402

Start

404

Receive input from query user and input is indicative of customizing parameters of the conversations and the parameters comprises a tone, a pacing, or a depth of interaction and the input corresponds to individual preferences and emotional needs of the query user.

406

Analyze the input from the query user for emotional cues and generating one or more relevant responses in the conversational content to enhance empathy and rapport in the interaction.

408

Evaluate the sentiment of the query user's input in real-time and adjusting the tone and style of the conversational content to maintain a positive and supportive interaction.

410

Employ natural language understanding (NLU) and natural language generation (NLG) techniques to analyze and generate the conversational content in multiple languages to enable cross-linguistic and cross-cultural interactions between the query user and the trained conversation simulation.

412

End

FIG. 4

METHOD AND A SYSTEM FOR ADAPTIVE GENERATION OF CONVERSATIONAL CONTENT

TECHNICAL FIELD

The present disclosure in general relates to conversation systems. More particularly, the present disclosure relates to adaptive generation of conversational content through a sophisticated system that integrates real-time data processing, personalized user profiling, and advanced conversational technologies. The present disclosure leverages multimodal interactions, machine learning, and artificial intelligence to facilitate engaging, personalized, and dynamic conversations between query users and a trained conversational simulator.

BACKGROUND

Traditional conversational systems often fail to provide personalized and contextually relevant interactions. Conversational systems may not adequately understand individual user preferences, emotional states, or contextual cues, resulting in generic and less engaging conversations. Many existing systems cannot dynamically adapt to real-time feedback or changes in user behavior during interactions. This limitation hinders the system's ability to maintain user engagement and satisfaction throughout the conversation. Conventionally, integrating and synchronizing different communication modalities (text, voice, and visual inputs) is technically challenging. Existing systems struggle to provide a seamless and coherent multi-modal interaction experience, limiting accessibility and user engagement. Conversational content requires significant computational resources and efficient algorithms to process large volumes of diverse data in real-time. Traditional systems often lack the scalability and efficiency needed to handle such data-intensive tasks effectively. Many systems do not adequately address privacy-preserving techniques, leading to potential risks of data breaches and misuse of sensitive information. Systems need to understand and respond to emotional cues, which requires advanced sentiment analysis and natural language understanding capabilities. Conversations that are emotionally engaging and empathetic are difficult to create. Systems often lack robust predictive models capable of identifying patterns and trends indicative of future user interests. A user's needs and preferences to proactively generate relevant conversational content is complex to anticipate.

Rule-based systems use predefined rules and scripts to respond to user inputs. Personalization is limited to manually created branches in conversation flows. Some systems use simple profiling techniques based on limited user data, such as basic demographic information or historical interaction data. Rule-based systems cannot adapt to complex user preferences and contexts dynamically, leading to static and repetitive interactions. Basic profiling does not account for the depth of user preferences, emotional states, and real-time context, resulting in generic interactions that fail to engage users meaningfully. In static response generation responses are generated based on fixed patterns or templates without considering real-time feedback. Some systems periodically update their response strategies based on aggregate user data, but these updates are not real-time. Periodic updates do not allow the system to respond to immediate changes in user behavior or feedback, leading to a lag in adapting interactions. Static responses fail to maintain engagement as they do not evolve based on ongoing user inputs and interaction patterns. Many systems are designed to handle only one mode of communication, such as text or voice, but not both simultaneously. Some systems process different modalities separately without integrating them, leading to disjointed user experiences.

Further, user experience handling only one modality or having separate processing pipelines results in fragmented interactions, reducing the overall coherence and engagement of the conversation. In limited accessibility systems, users cannot switch seamlessly between modalities based on their preferences or needs, limiting the accessibility and versatility of the system. Data is processed on central servers, which can become bottlenecks under heavy loads. Systems process data in batches rather than in real time, leading to delays. Centralized processing can lead to high latency, especially under peak loads, resulting in slow and unresponsive interactions. Batch processing and centralization limit the system's ability to scale efficiently, affecting performance during high-demand periods. In centralized data storage, user data is often stored and processed on central servers, increasing the risk of data breaches.

Data is protected using standard encryption techniques, but these do not address all privacy concerns, especially when data is centralized. Centralized storage of sensitive data increases the vulnerability to cyber-attacks and unauthorized access. Basic encryption does not provide comprehensive privacy controls, leaving user data potentially exposed to misuse.

Basic sentiment analysis tools are sometimes added to systems to gauge user emotions, but these are often superficial. Some systems use scripted responses to simulate empathy, but these lack genuine understanding and adaptability. Basic sentiment analysis tools cannot deeply understand or respond to nuanced emotional cues, leading to ineffective emotional engagement. Robotic interactions are scripted responses that fail to adapt to real-time emotional changes, making interactions feel artificial and disconnected.

Systems analyze historical user data to predict future interactions, but these predictions are often simplistic and not real-time. Simple trend analysis techniques identify broad patterns but lack precision in anticipating individual user needs. Historical data analysis alone does not account for dynamic changes in user behavior and preferences, leading to inaccurate predictions. Basic trend analysis does not enable truly proactive engagement, as it reacts to past data rather than anticipating future needs.

As a result, there is a need for a method and a system for adaptive generation of conversational content to facilitate engaging, personalized, secure and dynamic conversations between users.

Further limitations and disadvantages of conventional and traditional approaches will become apparent to one of skill in the art, through comparison of described systems with some aspects of the present disclosure, as set forth in the remainder of the present application and with reference to the drawings.

SUMMARY

In an embodiment, a method for adaptive generation of conversational content is disclosed. The method may be implemented on an application server. The method comprises receiving data associated with a first user from a plurality of sources. In one embodiment, the data is provided by an input user, which may be either a living person associated with the first user or the first user himself/herself.

The method comprises creating a personalized profile associated with the first user based on the received data. The method comprises generating conversational content in real-time to enable interaction between the at least one query users and a trained conversation simulator based on the personalized profile associated with the first user. The method comprises providing the conversational content to the at least one query users during an interaction with the trained conversation simulator, wherein during the interaction, the at least one query users provides at least one input queries, and the trained conversation simulator generates the conversational content in real-time in response to the at least one input queries provided by the at least one query users. The method comprises dynamically adapting the conversational content based on real-time feedback from the at least one query users and at least one interaction patterns within the interaction, wherein the dynamically adapted conversational content is personalized and provides an engaging interaction experience. The method comprises providing the dynamically adapted conversational content to the at least one query users during the interaction.

In another embodiment, an application server to adaptively generate conversational content is disclosed. The application server comprises a processor and a memory, communicatively coupled with the processor, wherein the memory stores processor-executable instructions, which on execution cause the processor to receive data associated with a first user from a plurality of sources.

In another embodiment, the data is provided by an input user who may be a living person associated with the first user or the first user himself or herself. The application server is configured to create a personalized profile associated with the first user based on the received data. The application server is configured to generate conversational content in real-time on behalf of the first user to enable interaction between at least one query users and a trained conversation simulator based on the personalized profile associated with the first user. The application server is configured to provide the conversational content to the at least one query users during an interaction, wherein during the interaction, the at least one query users provides at least one input queries and the trained conversation simulator generates the conversational content in real-time in response to the at least one input queries provided by the at least one query users. The application server is configured to dynamically adapt the conversational content based on real-time feedback from the at least one query users and at least one interaction patterns within the interaction, wherein the dynamically adapted conversational content is personalized and provides an engaging interaction experience. The application server is configured to provide the dynamically adapted conversational content to the at least one query users during the interaction.

BRIEF DESCRIPTION OF DRAWINGS

The accompanying drawings illustrate the various embodiments of systems, methods, and other aspects of the disclosure. Any person with ordinary skills in the art will appreciate that the illustrated element boundaries (e.g., boxes, groups of boxes, or other shapes) in the figures represent one example of the boundaries. In some examples, one element may be designed as multiple elements, or multiple elements may be designed as one element. In some examples, an element shown as an internal component of one element may be implemented as an external component in another, and vice versa. Further, the elements may not be drawn to scale.

Various embodiments will hereinafter be described in accordance with the appended drawings, which are provided to illustrate and not to limit the scope in any manner, wherein similar designations denote similar elements, and in which:

FIG. 3 is a flowchart that illustrates a method for adaptive generation of conversational content, in accordance with an embodiment of present invention.

FIG. 4 is a flowchart that illustrates a method for adaptive generation of conversational content, in accordance with an embodiment of present invention.

DETAILED DESCRIPTION

Figure 1:
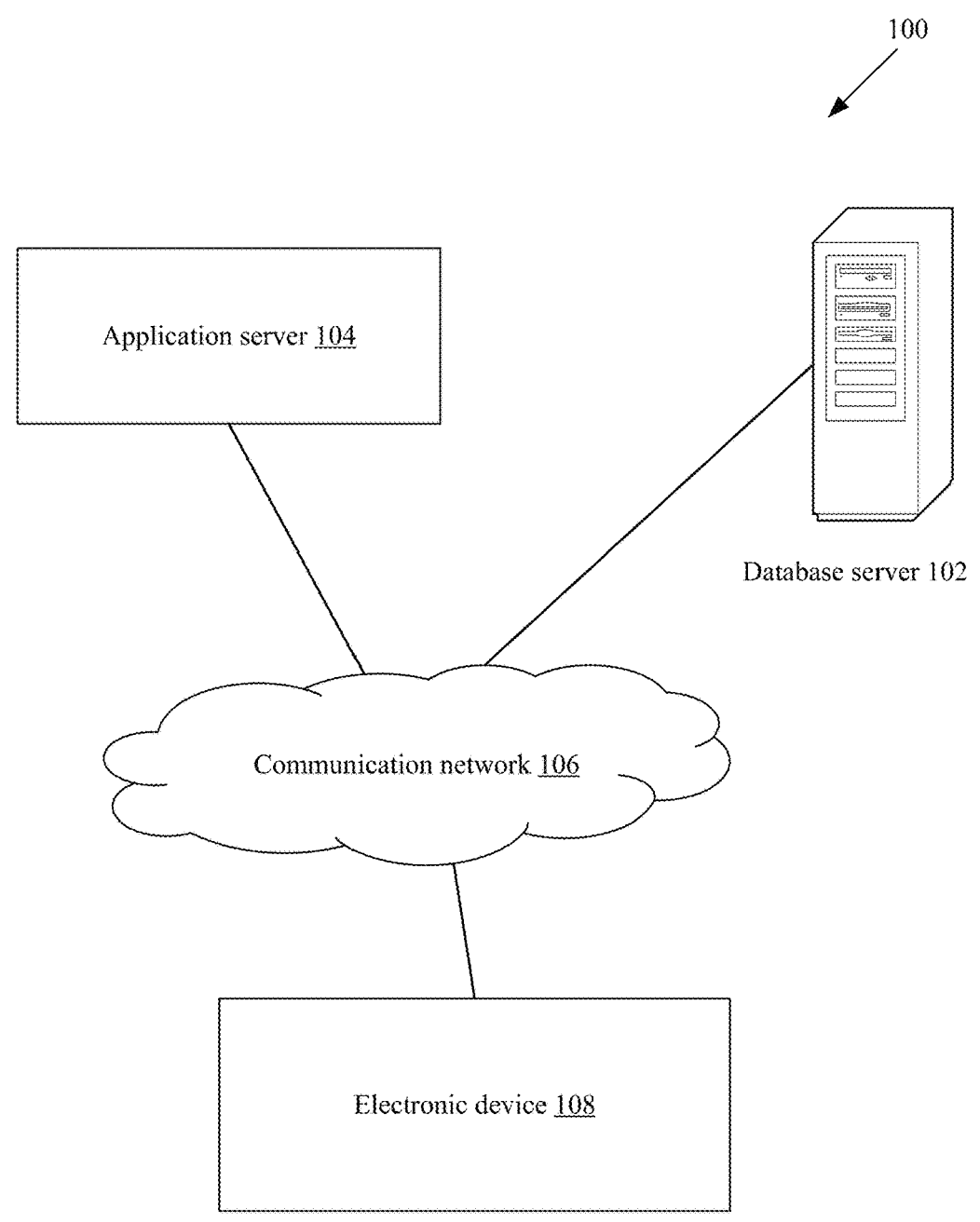
FIG. 1 is a block diagram that illustrates a system environment in which various embodiments of the method and the system may be implemented.

The present disclosure may be best understood with reference to the detailed figures and description set forth herein. Various embodiments are discussed below with reference to the figures. However, those skilled in the art will readily appreciate that the detailed descriptions given herein with respect to the figures are simply for explanatory purposes as the methods and systems may extend beyond the described embodiments. For example, the teachings presented and the needs of a particular application may yield multiple alternative and suitable approaches to implement the functionality of any detail described herein. Therefore, any approach may extend beyond the particular implementation choices in the following embodiments described and shown.

References to "one embodiment," "at least one embodiment," "an embodiment," "one example," "an example," "for example," and so on indicate that the embodiment(s) or example(s) may include a particular feature, structure, characteristic, property, element, or limitation but that not every embodiment or example necessarily includes that particular feature, structure, characteristic, property, element, or limitation. Further, repeated use of the phrase "in an embodiment" does not necessarily refer to the same embodiment.

The primary objectives of the present disclosure are centered on enhancing the quality, personalization, and engagement of conversational interactions between users and digital systems. The present disclosure aims to address several technical challenges faced by conventional systems. Another objective of the present disclosure is to create highly personalized conversational content tailored to individual user preferences, emotional states, and contextual factors. Another objective of the present disclosure is to utilize detailed user profiles derived from diverse data sources, including social media, biometric data, and personal communications. Yet another objective of the present disclosure is to dynamically adapt conversational content in real time based on user feedback and interaction patterns. Yet another objective of the present disclosure is to employ advanced machine learning algorithms to continuously analyze user inputs and then adjust generated responses accordingly. This ensures interactions remain relevant and engaging. Yet another objective of the present disclosure is to integrate multiple communication modalities (text, voice, visual) into a seamless and coherent interaction experience.

Yet another objective of the present disclosure is to develop capabilities to synchronize and process different modalities simultaneously, enhancing accessibility and user engagement. Yet another objective of the present disclosure is to efficiently process large volumes of diverse data in real time for generating and adapting conversational content. Yet another objective of the present disclosure is to create emotionally engaging and empathetic conversations that resonate with users on a personal level. Yet another objective of the present disclosure is to integrate sophisticated sentiment analysis and natural language understanding to generate empathetic responses based on real-time emotional cues. Yet another objective of the present disclosure is to provide a mechanism for monetizing the generation and adaptation of conversational content. Yet another objective of the present disclosure is to implement a payment system that allows users to pay for personalized and dynamically adapted conversational services.

The present disclosure pertains to a sophisticated system for the adaptive generation of conversational content, designed to create personalized, dynamic, and engaging interactions between users and digital systems. The data collection unit aggregates data from a wide variety of sources, including image data, voice data, social media posts, emails, personal diaries, and biometric data such as heart rate, galvanic skin response, and facial expressions to create statistical models emulating a first user's responses. Profile creation unit creates personalized profiles for each user based on the collected data, encompassing psychological and behavioral analysis, personality traits, cognitive styles, and individual preferences. The conversation simulator unit generates real-time conversational content on behalf of a first user, utilizing advanced natural language understanding (NLU) and natural language generation (NLG) techniques. The real-time interaction unit facilitates interactions between users, dynamically adapting content based on real-time feedback, contextual cues, and interaction patterns to maintain engagement and relevance. The feedback analysis unit analyzes real-time feedback from user interactions, including biometric data and emotional cues, to continuously refine and adapt conversational content. The predictive modelling unit uses predictive neural network models to anticipate future user interests and preferences based on historical data and contextual information. The customization unit allows users to customize conversation parameters such as tone, pacing, and depth, ensuring that interactions align with individual preferences and emotional needs. The training unit continuously trains the conversation simulator using federated learning techniques, enhancing conversational strategies while preserving user privacy. The payment unit manages transactions related to the generation and dynamic adaptation of conversational content, providing a monetization mechanism for the service. Multi-modal interaction unit enables interactions through multiple modalities, including text, voice, and visual inputs, ensuring a seamless and immersive user experience.

FIG. 1 is a block diagram that illustrates a system environment 100 in which various embodiments of the method may be implemented. The system environment 100 typically includes a database server 102, an application server 104, a communication network 106, and an electronic device 108 are typically communicatively coupled with each other via the communication network 106.

The database server 102 receives data associated with the first user from a multitude of sources. In an embodiment, the data is provided by an input first user who may be either a living person associated with the first user or the first user himself/herself. This database server includes image data, voice data, social media posts, language preferences, demographic data and other relevant personal information. The database server collects data from interviews, online social media, acquaintances, personal diaries, and emails. The database server 102 must handle large volumes of diverse data types, necessitating robust storage capabilities and efficient indexing for quick retrieval. The application server 104 utilizes the database to create personalized profiles for the first user. This involves aggregating and integrating various data points to build a comprehensive profile and storing these profiles in a structured format to facilitate easy access and updates. The database server 102 ensures these profiles are updated in real-time as new data becomes available. The database server 102 generates and adapts real-time content such as real-time data processing capabilities, the database server 102 provides quick access to user profiles and other relevant data required by the conversation simulator. The database server 102 ensures low latency in data retrieval to enable the real-time interaction required for dynamic content adaptation. The database server 102 stores real-time feedback from the at least one query users, which may include, and not be limited to, biometric data such as heart rate, galvanic skin response, or facial expressions. This feedback data is analyzed to adapt the conversational content dynamically. The database server 102 must efficiently handle the storage and retrieval of this feedback data to enable the application server to personalize and modify the interactions promptly.

In the context of adaptive generation of conversational content, data accumulation, collection, and management play a crucial role in ensuring personalized and contextually relevant interactions. The data is sourced from a variety of inputs, such as text, voice, images, video, and social media posts. Machine learning (ML) models and artificial intelligence (AI) systems manage the data by categorizing and sorting it into meaningful clusters that reflect the behavioral patterns, preferences, and emotional states of the users. Such multi-modal data is then organized and structured through feature extraction techniques, which allow the models to highlight key aspects such as tone, sentiment, facial construction, emotional emulation, and topic relevance. Additionally, the data undergoes continuous refinement and updates as the users interact with the conversation simulator, making the profiles dynamic and increasingly precise over time.

AI and ML models are also responsible for managing the flow of information in real-time, ensuring that the accumulated data is used to generate conversational content that aligns with the needs of the query users. Deep learning models, such as neural networks, analyze this data to identify patterns and trends in user behavior, enabling predictive models to anticipate future preferences. These models also classify and rank incoming data to prioritize real-time feedback, making the interaction more engaging. Further, the data security and privacy concerns are addressed through encryption, anonymization, and federated learning techniques that ensure the conversation simulator is trained on distributed data without compromising user privacy. This entire process of data collection, management, and sorting allows the AI-driven system to become more adept at providing contextually aware, personalized, and emotionally resonant interactions.

The database server 102 stores historical data and contextual cues used by predictive neural network models. This data helps in anticipating the future interests and preferences of the at least one query users. The predictive models rely on historical data patterns stored in the database to generate proactive conversational content. The database server 102 maintains records of user preferences related to conversation parameters such as tone, pacing, and depth of interaction. The database server 102 also supports storing multilingual data to enable cross-linguistic and cross-cultural interactions. The database server 102 manages the preferences and customizations for personalized content delivery. The database server 102 stores engagement levels and satisfaction scores that serve as rewards for reinforcement learning models. The database server 102 supports federated learning by managing distributed data sources while ensuring user privacy of the at least one query users. Database server 102 stores psychological and behavioral analysis data to tailor content based on personality traits and cognitive styles. The database server 102 also records payment and any other pertinent information from users.

The database server 102 manages transactions for services such as the generation and dynamic adaptation of conversational content. The database server 102 ensures secure and efficient handling of financial data. The database server 102 stores the necessary data to create virtual representations of the first user. The database server 102 integrates with AR/VR environments to provide a 3D immersive experience, enhancing interaction with contextual visual and auditory stimuli.

The application server 104 is central to the adaptive generation of conversational content, coordinating various processes and ensuring real-time interaction between the at least one query users and the trained conversational simulator. The application server 104 receives data from a variety of sources, including image data, voice data, video data, social media posts, language preferences, demographic data, interviews, social media, news sources, acquaintances, personal diaries, and emails. This diverse data is crucial for building comprehensive user profiles. By using this data, the application server 104 creates personalized profiles for the first user. The application server 104 aggregates and integrates data to reflect users' preferences, behaviors, and characteristics. The application server 104 generates conversational content in real-time, by utilizing a trained conversation simulator that leverages the personalized profiles, by creating content that is relevant and engaging based on the current context and real-time data. The content generation process is designed to facilitate interactions between the at least one query users and the trained conversation simulator and to adapt dynamically to ensure the interaction remains engaging and personalized. The application server 104, during interactions, provides the generated conversational content to the at least one query users, and receives real-time feedback from the at least one query users, including biometric data (e.g., heart rate, galvanic skin response, facial expression analysis). By using this feedback, the application server 104 analyzes and adapts the conversational content dynamically. The application server 104 ensures the content is personalized to match the at least one query users physiological and emotional state. The application server 104 employs predictive neural network models to anticipate the future interests and preferences of the at least one query users based on historical data and contextual cues. In an embodiment, based on the conversational content the predictive neural network utilizes the historical data and the contextual cues for generating predictive replies. For example, if a query user says that "I have lived in large houses all my life and am now thinking of relocating to New York City", then the answer might be that "You should look for houses in Long Island, where you could find a larger home, as opposed to the City".

The application server 104 proactively generates conversational content that aligns with the evolving needs and preferences of the at least one query users. These predictive capabilities in the application server 104 allow the server to identify patterns and trends in user behavior over time, to create content that is forward-looking and aligned with anticipated user needs. The application server 104 enables the customization of conversations based on input from the at least one query users, and can adjust parameters such as tone, pacing, and depth of interaction to suit their preferences and emotional needs.

The application server 104 analyzes emotional cues from the input and generates responses to enhance empathy and rapport. Additionally, the application server 104 evaluates the sentiment of the inputs in real time. The application server 104 adjusts the tone and style of conversational content to maintain a positive and supportive interaction. The application server 104 facilitates interactions across different languages and cultures. The application server 104 uses natural language understanding (NLU) and natural language generation (NLG) techniques. The application server 104 generates conversational content in multiple languages, enabling cross-linguistic and cross-cultural interactions. The trained conversation simulator, employed by the application server 104, is continuously trained using reinforcement learning models. The application server 104 receives rewards based on user (at least one query users) engagement levels and satisfaction scores. The application server 104 uses federated learning techniques to train the simulator across multiple devices and data sources while maintaining privacy of the at least one query users. The personalized profiles include psychological and behavioral analyses, allowing the application server 104 for tailored content creation based on personality traits, cognitive styles, and individual psychological needs. The application server 104 handles transactions related to the conversational content. The application server 104 may receive payments from the at least one query users for generating and dynamically adapting conversational content. The application server 104 manages billing and payment processing securely.

One potential embodiment would be to generate a conversation in the manner and style of a deceased person. For such interactions involving deceased users or virtual representations, the application server 104 creates and displays virtual representations of the first user.

The communication network 106 facilitates the transmission of data between various sources and the application server 104. For the real-time generation and delivery of conversational content, the communication network 106 ensures low-latency transmission of data, allowing the application server 104 to generate and provide conversational content instantaneously. The communication network 106 is configured for providing reliable and continuous data flow to support dynamic content adaptation based on real-time feedback from the at least one query users. In an embodiment, the trained conversational simulator is hosted in a cloud based server and the communication network transfers the necessary conversational content to the electronic device of the at least one query users. In an embodiment, the network's efficiency directly impacts the responsiveness and quality of the interactions. The Communication Network 106 is responsible for transmitting real-time feedback from the at least one query users, including biometric data such as heart rate, galvanic skin response, stress levels, body movements, blood pressure, and facial expressions. The Communication Network 106 ensures that this feedback reaches the application server 104 promptly for dynamic analysis and adaptation of the conversational content. This enables the application server 104 to personalize the interaction based on the at least one query users physiological and emotional state.

The communication network 106 supports the predictive capabilities of the application server 104 by facilitating the exchange of historical data and contextual cues required for predictive neural network models. The communication network 106 ensures that data patterns and trends indicative of at least one query users interests and preferences are transmitted efficiently for proactive content generation. This helps the application server 104 anticipate future needs of the at least one query users and generate relevant conversational content. The communication network 106 supports the customization of interactions by transmitting at least one query users' inputs that indicate preferences for conversation parameters such as tone, pacing, and depth. The communication network 106 allows the application server 104 to analyze these inputs and adjust the conversational content accordingly. Additionally, the communication network 106 enables real-time sentiment analysis by transmitting user inputs quickly for immediate evaluation and response adjustment. The communication network 106 supports the transmission of engagement levels and satisfaction scores used in reinforcement learning models. The Communication Network 106 facilitates federated learning by enabling the exchange of training data across multiple devices and data sources while maintaining user (at least one query users) privacy. This ensures that the conversation simulator can learn and improve its strategies without compromising user data security. The communication network 106 also supports monetization aspects by enabling secure transmission of payment data from the at least one query users to the application server. The communication network 106 also ensures reliable and secure processing of transactions related to the generation and dynamic adaptation of conversational content. The communication network 106 supports the transmission of data necessary for creating and displaying virtual representations of the first user/deceased user.

The electronic device 108, which can be a smartphone, tablet, smart watch, computer, or any other internet-connected device, is a crucial component in the adaptive generation of conversational content. This device serves as the primary interface through which the at least one query users interact with the application server and access the generated conversational content. The electronic device 108 collects and transmits data about the deceased user/first user including image data, voice data, and social media posts. The electronic device 108 also collects user preferences, demographic data, and other relevant personal information. Inputs from interviews, videos, still digital images, personal diaries, emails, and other communications. This data is sent to the application server to create comprehensive personalized profiles for the first user. The electronic device 108 is essential for facilitating real-time interactions by displaying the generated conversational content to the at least one query users, by allowing the at least one query users to provide input conversations during the interaction, by ensuring that the conversation feels natural and engaging by leveraging the device's capabilities (e.g., touchscreen, microphone, and camera). The electronic device 108 can capture and transmit real-time feedback from the at least one query users, including biometric data such as heart rate, galvanic skin response, stress levels, blood pressure, and facial expressions using built-in sensors or connected wearable devices, emotional cues and user responses that are analyzed by the application server to adapt the conversational content dynamically.

The electronic device 108 allows the at least one query users to customize their interactions by providing inputs that indicate preferences for conversation parameters such as tone, pacing, and depth of interaction, by enabling sentiment analysis by capturing real-time emotional cues through text, voice, and facial expressions. The electronic device 108 ensures that these inputs are quickly transmitted to the application server 104 for immediate content adaptation. The electronic device 108 supports multilingual and cross-cultural interactions by displaying conversational content generated in multiple languages, by utilizing the device's language settings and input methods to facilitate communication across different languages and cultural contexts. The electronic device 108 helps anticipate user (at least one query users) needs by storing historical interaction data and contextual cues, by sending this data to the application server, which uses predictive neural network models to generate content aligned with the at least one query users evolving preferences and interests. The electronic device 108 plays a role in the continuous improvement of the conversation simulator by collecting engagement levels and satisfaction scores from user interactions, by transmitting this data to the application server to refine conversational strategies using reinforcement learning models. The electronic device 108 facilitates monetization by enabling secure payment transactions for services related to conversational content generation and adaptation, by ensuring user data privacy and security during financial transactions.

Figure 2:
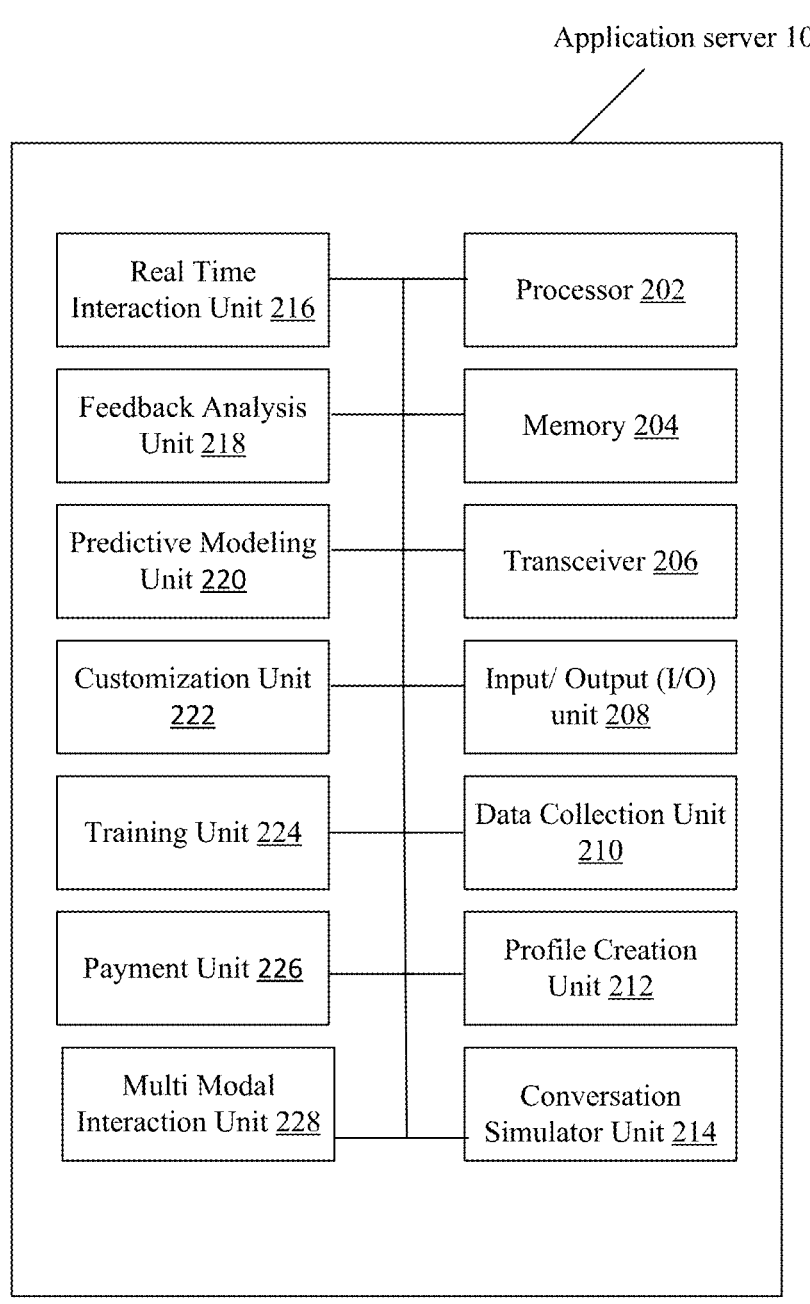
FIG. 2 is a block diagram that illustrates an application server 104 configured to adaptively generate conversational content, in accordance with an embodiment of present disclosure.

FIG. 2 is a block diagram that illustrates an application server 104 configured to adaptively generate conversational content, in accordance with an embodiment of the present invention. FIG. 2 is explained in conjunction with elements from FIG. 1. Here, the application server 104 preferably includes a processor 202, a memory 204, a transceiver 206, an input/output unit 208, and a Data collection unit 210, a Profile creation unit 212, a Conversation simulator unit 214, Real Time Interaction unit 216, Feedback analysis unit 218, Predictive Modeling unit 220, Customization unit 222, Training unit 224, Payment unit 226, Multi Modal Interaction unit 228.

The Processor 202 comprises suitable logic, circuitry, interfaces, and/or code that may be configured to execute a set of instructions stored in the memory 204, and may be implemented based on several Processor 202 technologies known in the art. The processor 202 works in coordination with a transceiver 206, an input/output unit 208, and a Data collection unit 210, a Profile creation unit 212, a Conversation simulator unit 214, a Real Time Interaction unit 216, a Feedback analysis unit 218, a Predictive Modeling unit 220, a Customization unit 222, a Training unit 224, a Payment unit 226 and a Multi Modal Interaction unit 228. Examples of the processor 202 include, but not limited to, an x86-based processor, a Reduced Instruction Set Computing (RISC) processor, an Application-Specific Integrated Circuit (ASIC) processor, and a Complex Instruction Set Computing (CISC) processor, for example.

The memory 204 comprises suitable logic, circuitry, interfaces, and/or code that may be configured to store the set of instructions, which are executed by the processor 202. Preferably, the memory 204 is configured to store at least one programs, routines, or scripts that are executed in coordination with the processor 202. Additionally, the memory 204 may be implemented based on a Random access memory (RAM), a Read-Only Memory (ROM), a Hard Disk Drive (HDD), optical memory storage, a storage server, and/or a Secure Digital (SD) card.

The transceiver 206 comprises suitable logic, circuitry, interfaces, and/or code that may be configured to obtain at least one attributes associated with an application server. The Transceiver 206 enables wireless communication capabilities, allowing the device to connect to Wi-Fi networks, Bluetooth-enabled devices, or cellular networks. This connectivity facilitates data exchange, firmware updates, and remote configuration. The Transceiver 206 serves as the interface for transmitting and receiving data packets over wireless networks. This includes exchanging information with other devices, accessing online resources, and transferring data to and from remote servers. The transceiver 206 supports various network protocols and standards, ensuring compatibility with different communication technologies. This versatility enables seamless integration with existing network infrastructures. The transceiver 206 may offer adjustable transmission power and bandwidth settings, allowing the device to optimize communication range and data transfer speeds based on environmental conditions and network requirements. The transceiver 206 incorporates security features such as encryption, authentication, and data integrity checks to ensure secure communication over wireless networks. This protects sensitive information and prevents unauthorized access. The transceiver 206 could be implemented as a hardware module within the electronic device 106, comprising radio frequency (RF) components, antennas, and signal processing circuitry. Alternatively, it could be integrated into the device's system-on-chip (SoC) or as a separate module connected via interfaces such as USB or PCIe.

The Input/Output unit 208 includes components such as buttons, touchscreens, or touchpads that serve as user interfaces for interacting with the device. These interfaces enable at least one query users to input commands, initiate actions, and navigate menus. A display screen, such as an LCD or OLED panel, is part of the Input/Output unit 208 and provides visual feedback to the user. The Input/Output unit 208 displays decoded information, user notifications, augmented reality (AR) overlays, and other graphical elements. The Input/Output unit 208 could be implemented as a combination of hardware components, including buttons, touchscreens, speakers, microphones, and ports, integrated into the device's physical design. Additionally, software components would interface with these hardware elements to manage input/output unit 208 operations and user interaction. The input/output unit 208 comprises of various input and output devices that are configured to communicate with the processor 202. Examples of the input devices include but are not limited to, a keyboard, a mouse, a joystick, a touch screen, a microphone, a camera, and/or a docking station. Examples of the output devices include, but are not limited to, a display screen and/or a speaker.

The data collection unit 210 may include suitable logic, circuitry, interfaces, and/or code that may be configured to aggregate data from a wide array of sources, including personal data which includes image data, voice data, video data, social media posts, personal diaries, news sources, and emails, behavioral data which further includes language preferences, demographic information, user interactions on social media. The collection unit also collects information from interviews, details provided by acquaintances, and historical data. By integrating data from these varied sources, the unit ensures a holistic view of the preferences, behaviors, and characteristics of the first user/deceased user are captured. In an embodiment, the data is provided by an input user and the input user is a living person associated with the first user. For example, the input user may be a living family member of a first/deceased user. In another embodiment, the input user may be the first user themselves. In another embodiment, the input user may be a living person associated with the first user or may be the first user himself or herself (for instance, the first user is not deceased and the first user themselves provides the information about themselves to the data collection unit 210). The collected data is used to create personalized profiles for the first user who in this embodiment is a deceased user. These profiles include demographic information such as age, gender, photo imaging, location, etc. These profiles also include psychological and behavioral analyses of personality traits, cognitive styles, and individual psychological needs. These profiles collect preferences and interests based on social media activity, language use, and other contextual information.

The data collection unit 210 also gathers real-time data during user interactions which includes biometric data such as heart rate, galvanic skin response, blood pressure, stress levels, and facial expression analysis, and Interaction patterns such as user inputs, engagement levels, and emotional responses during conversations. This real-time data is crucial for dynamically adapting the conversational content to keep it relevant and engaging. The real-time data anticipates future needs and preferences of the at least one query user. The data collection unit 210 supports historical data analysis using past interactions and behavioral patterns to predict future interests. These predictive capabilities enable the proactive generation of conversational content that aligns with the at least one query users evolving needs. The data collection unit 210 captures user inputs that customize the conversational experience, such as tone and pacing preferences and user-specified parameters for how conversations should be conducted. The data collection unit evaluates the sentiment and emotional state of the at least one query users by analyzing input text, voice, and facial expressions for emotional cues.

The data collection unit 210 is configured to adjust conversational content to enhance empathy and rapport based on the at least one query users' emotional state. In an embodiment, the input user may also be a query user. The data collection unit 210 supports cross-linguistic and cross-cultural interactions by language preferences collecting and processing data in multiple languages, cultural context by understanding cultural nuances to generate appropriate conversational content, training data for reinforcement learning to improve the conversation simulator. The data collection unit 210 gathers, engagement metrics, user satisfaction scores, and interaction feedback. The data collection unit 210 use behavioral rewards in reinforcement learning models to refine conversational strategies. The data collection unit 210 employs federated learning techniques to ensure privacy training models across multiple devices and data sources without compromising user privacy. Further, the data collection unit 210 is configured to provide data security by implementing robust security measures to protect user data during collection and transmission.

Profile Creation Unit 212 is a fundamental component within the system for the adaptive generation of conversational content. The Profile Creation Unit 212 may include suitable logic, circuitry, interfaces, and/or code that may be configured for synthesizing data from various sources to build detailed and personalized user profiles, which serve as the foundation for generating relevant and engaging conversational content. The Profile Creation Unit 212 integrates data from multiple sources to form comprehensive user profiles. These sources include personal data such as image data, voice data, social media posts, video data, language preferences, and demographic data. The Profile Creation Unit 212 utilizes contextual data information from interviews, online social media, information from acquaintances, personal diaries, and emails for profile creation. Also, behavioral data, historical interaction patterns, user preferences, and engagement levels are utilized for profile creation. This holistic data integration ensures that the profiles are rich and detailed.

The Profile Creation Unit 212 synthesizes the collected data to create personalized profiles that encompass various aspects of the first user/deceased user and the at least one query users, including demographic information age, gender, location, and other basic details. The Profile Creation Unit 212 further uses past interactions, including conversation topics, user responses, and engagement metrics to create profiles of the first user. The profile creation unit continuously updates the user profiles based on real-time data during interactions. This includes biometric data incorporating physiological data such as heart rate, blood pressure, stress levels, galvanic skin response, and facial expressions. The profile creation unit is configured to utilize interaction feedback to adjust profiles based on user inputs, engagement levels, and emotional responses during ongoing conversations. These updates ensure that the profiles reflect the current state and preferences of the users. The profile creation unit uses predictive modelling to anticipate the future interests and preferences of the users by examining past interactions and behavioral patterns, by considering current situational factors and contextual information. This predictive capability allows the system to proactively generate content that aligns with the evolving needs of the users.

The profile creation unit incorporates user inputs for customization into the profiles, such as user preferences for the style and speed of conversations. These customization options help tailor the interactions to individual user preferences. The profile creation unit evaluates and incorporates the emotional state and sentiment of the users into their profiles by assessing text, voice, and facial expressions for emotional indicators. By adjusting profiles based on the user's current emotional state and responses during interactions ensures that the conversational content is empathetic and supportive. The profiles include information relevant to multilingual and cross-cultural interactions, preferred languages for communication, cultural nuances and norms that may affect conversation. This allows the system to generate appropriate and effective conversational content across different languages and cultures. The profile creation unit contributes to the training data used in reinforcement learning models by providing data on user satisfaction and engagement levels, by identifying successful conversational strategies based on historical interactions. This data is used to continuously improve the conversation simulator's performance. The profile creation unit employs federated learning techniques to train models using decentralized data to avoid compromising user privacy. The profile creation unit employs federated learning techniques to implement robust security measures to safeguard user data during profile creation and updates.

The profile creation unit is a fundamental component within the system for the adaptive generation of conversational content. The profile creation unit is responsible for synthesizing data from various sources to build detailed and personalized user profiles, which serve as the foundation for generating relevant and engaging conversational content. The profile creation unit integrates data from multiple sources to form comprehensive user profiles. These sources include image data, voice data, social media posts, language preferences, demographic data, and information from interviews, online social media and information from acquaintances, personal diaries, emails, historical interaction patterns, user preferences, and engagement levels. This holistic data integration ensures that the profiles are rich and detailed. The predictive capability using machine learning and artificial intelligence allows the system to proactively generate content that aligns with the evolving needs of the users. The unit incorporates user inputs for customization into the profiles, such as user preferences for the style and speed of conversations. These customization options help tailor the interactions to individual user preferences.

The conversation simulator unit 214 may include suitable logic, circuitry, interfaces, and/or code that may be configured to generate conversational content in real time to facilitate interactions between the at least one query users and the trained conversational simulator. The conversation simulator unit 214 may utilize the personalized profiles created for each user to tailor responses that align with their preferences, interests, and behavioral patterns. The conversation simulator unit 214 is configured to adjust the generated conversational content based on live feedback and interaction patterns to maintain relevance and engagement. The conversation simulator unit 214 leverages diverse data sources, to generate conversational content, including detailed profiles containing demographic, psychological, behavioral information, current context, live events, news updates, and user-specific information to ensure the conversational content is pertinent and timely. The conversation simulator unit 214 employs predictive neural network models to anticipate future interests and preferences of users by examining past interactions and behaviors to identify patterns and trends, and by considering real-time contextual information to forecast user needs and proactively generate appropriate conversational content. The simulator allows for customization based on inputs from at least one query users, such as adapting the tone, pacing, and depth of the interaction to match user preferences, evaluating emotional inputs from the at least one query users and adjusting responses to enhance empathy and rapport.

The conversation simulator unit 214 supports multilingual and cross-cultural interactions by using natural language understanding (NLU) and natural language generation (NLG) techniques to generate conversational content in multiple languages, by incorporating cultural nuances to ensure the conversational content is appropriate and effective across different cultural contexts. The simulator employs reinforcement learning models to continuously improve its conversational strategies by receiving rewards based on user engagement levels and satisfaction scores. The conversation simulator unit 214 is configured to adjust strategies and responses based on ongoing interactions to enhance performance over time. To ensure privacy and security, the conversation simulator unit 214 utilizes federated learning techniques by training models across multiple devices and data sources without aggregating sensitive user data centrally. The conversation simulator unit 214 by maintaining user data privacy while enhancing the simulator's capabilities through distributed learning processes. The simulator dynamically adapts the conversational content based on real-time feedback from users by monitoring user inputs, engagement, and emotional responses during interactions. By modifying the content on the fly to maintain a positive and engaging user experience, the conversation simulator unit 214 supports various interaction modes, including enabling multi-modal interactions to cater to user preferences. The conversation simulator unit 214 can facilitate a range of interactions, such as providing simulated conversations for emotional support, especially in scenarios where the first user might be deceased or also by engaging users through educational content or entertainment-based interactions.

The real-time interaction unit 216 is a crucial component within the system for the adaptive generation of conversational content. It facilitates live, dynamic interactions between the at least one query users and the trained conversational simulator, ensuring that the conversational content is responsive, engaging, and contextually appropriate. The real-time interaction unit 216 processes incoming data from user interactions instantaneously, including capturing text, voice, and visual inputs provided by users during the interaction, by incorporating physiological data such as heart rate, galvanic skin response, and facial expressions to gauge the user's emotional and physiological state. The real-time interaction unit 216 adapts the conversational content on the fly based on real-time feedback and interaction patterns, including continuously analyzing responses from the at least one query users and engagement levels to modify the content accordingly. The real-time interaction unit 216 is configured to identify patterns within the interaction to tailor responses and maintain an engaging dialogue. The real-time interaction unit 216 monitors user engagement levels by assessing the emotional tone and sentiment of user inputs through natural language processing (NLP) and emotional analysis techniques. The real-time interaction unit 216 by tracking metrics such as response time, frequency of interactions, and user satisfaction scores can enhance the conversational experience.

The real-time interaction unit 216 adjusts content based on the user's (at least one query users) emotional state by evaluating the sentiment of user inputs to determine their emotional tone, by modifying the tone and style of responses to be empathetic and supportive, fostering a positive interaction. The real-time interaction unit 216 supports user-driven customization by allowing users (at least one query users) to set preferences for tone, pacing, and depth of interaction, by generating responses that align with the user's individual preferences and emotional needs. The real-time interaction unit 216 ensures that the conversational content is suitable for users (at least one query users) from diverse linguistic and cultural backgrounds by utilizing natural language understanding (NLU) and natural language generation (NLG) to support multiple languages. The real-time interaction unit 216 ensures that the conversation remains engaging and forward-looking by generating conversational content that aligns with anticipated user needs. The real-time interaction unit 216 incorporates reinforcement learning techniques to continuously improve its performance by using real-time user feedback to refine conversational strategies. The real-time interaction unit 216 is further configured to adjust responses based on engagement levels and satisfaction scores to optimize user experience. To protect user (at least one query users) privacy, the real-time interaction unit 216 employs federated learning and secure data handling practices by training models across multiple devices without aggregating sensitive data centrally. The real-time interaction unit 216 is configured to ensure that user data is processed securely and in compliance with privacy regulations. The real-time interaction unit 216 is versatile and can be applied in various scenarios, such as facilitating conversations that provide emotional support, particularly in cases where one user is deceased, by engaging users through educational content or interactive entertainment experiences.

The feedback analysis unit 218 plays a crucial role in the system for the adaptive generation of conversational content. The feedback analysis unit 218 processes user feedback in real time to understand user preferences, engagement levels, and emotional responses, thereby enabling the system to dynamically adapt and optimize conversational interactions. The feedback analysis unit 218 continuously processes user feedback during conversational interactions, including analyzing text, voice, and visual inputs provided by users during conversations. The feedback analysis unit 218 by incorporating physiological signals such as heart rate, galvanic skin response, stress levels and facial expressions to assess the at least one query users' emotional state. The feedback analysis unit 218 monitors various engagement metrics to gauge the effectiveness of the conversational content, including assessing the time taken by users to respond to prompts or messages, tracking the frequency and duration of interactions to measure user engagement, and collecting user ratings and feedback to evaluate the overall satisfaction with the conversation. The feedback analysis unit 218 is configured to understand the emotional responses of users (at least one query users) and the feedback analysis unit 218 is configured for assessing the sentiment and emotional tone of user inputs using natural language processing (NLP) techniques.

The feedback analysis unit 218 identifies emotional cues from facial expressions, voice intonation, and other non-verbal signals. The feedback analysis unit 218 by analyzing feedback, the unit identifies user preferences and behavior patterns, including recognizing topics of conversation styles that resonate with the user. The feedback analysis unit 218 understands the user's preferred tone, pacing, and depth of interaction. Based on feedback analysis, the feedback analysis unit 218 dynamically adapts and optimizes the conversational content by adjusting the tone, style, and content of responses to align with user preferences and emotional states. The feedback analysis unit by tailoring interactions to individual user profiles and past feedback enhances relevance and engagement. The feedback analysis unit 218 incorporates predictive modelling techniques to anticipate future user needs and preferences by identifying trends and patterns in user feedback to predict future behavior. The feedback analysis unit 218 is configured for generation of conversational content that anticipates at least one query users interests and maintains engagement over time.

The feedback analysis unit 218, leveraging feedback analysis, contributes to the continuous improvement of the conversation simulator by using feedback to refine conversational strategies and improve user satisfaction. Further, by incorporating user feedback as rewards in reinforcement learning models the conversational performance is further optimized. The feedback analysis unit is configured to ensure user privacy and data security and adhere to strict privacy measures by including processing feedback data without storing personally identifiable information. The feedback analysis unit 218 implements encryption and access controls to protect sensitive user data.

The predictive modelling unit 220 plays a central role in the system for the adaptive generation of conversational content. The predictive modelling unit 220 anticipates future user needs and preferences, enabling proactive content generation and enhancing the overall conversational experience by leveraging historical data and contextual cues. The predictive modelling unit 220 also analyzes historical user interactions and behavioral patterns to identify trends and preferences. The unit 220 examines past conversations by studying previous dialogues and user responses to understand recurring topics and engagement levels, by analyzing feedback data, including satisfaction scores and ratings, to assess user preferences and satisfaction with past interactions. In addition to historical data, the unit incorporates real-time contextual cues to anticipate future user needs. This includes monitoring current events, news updates, and other situational factors that may influence user interests, by considering the user's current context, location, and recent activities to tailor conversational content accordingly. The unit 220 by identifying patterns and correlations within the data, the predictive modelling unit can predict future user behavior. The unit 220 generates conversational content proactively, using insights from historical data and predictive analysis. This involves crafting responses that anticipate and address potential user needs before they are explicitly expressed. The predictive modelling unit 220 is configured for designing content to maintain user interest and engagement over time by aligning with predicted preferences. The predictive modelling unit 220 continuously learns from user interactions to refine its predictive capabilities and optimize content generation The customization unit 222 is a pivotal component within the system for the adaptive generation of conversational content. It enables the at least one query users to tailor their conversational experiences with the trained conversational simulator according to their individual preferences, ensuring that interactions are personalized, engaging, and relevant. The customization unit 222 processes user input to understand their customization preferences. This includes analyzing user-provided parameters such as tone, pacing, and depth of interaction, by identifying emotional cues from user inputs to tailor responses accordingly. By analyzing user inputs and historical data, the customization unit 222 identifies user preferences and customization patterns, including by recognizing preferred conversational tones (e.g., formal, casual) and styles (e.g., humorous, informative). Based on user preferences, the customization unit dynamically adapts the conversational content by modifying the tone and style of responses to match user preferences, ensuring consistency and resonance. The customization unit 222 is configured to adjust the speed and rhythm of interactions to align with the user's preferred pacing. The unit 222 integrates real-time feedback from users to refine customization parameters and optimize interactions. This involves analyzing user responses and engagement levels to assess the effectiveness of customization settings and continuously updating customization parameters based on user feedback to enhance the conversational experience over time. The unit 222 enhance empathy and rapport in interactions, the customization unit 222 incorporates emotional intelligence by evaluating emotional cues from user inputs and adjusting responses to empathize with the user's emotional state, by crafting responses that demonstrate understanding and empathy towards the user's feelings and concerns. The customization unit 222 supports multilingual and cross-cultural interactions by generating content in multiple languages based on user preferences, incorporating cultural nuances and preferences into conversations to ensure relevance and appropriateness, by empowering users to customize their conversational experiences fosters a sense of ownership and satisfaction.

Training unit 224 is a foundational component within the system for the adaptive generation of conversational content. The unit 224 encompasses the processes of model training, reinforcement learning, and continuous improvement to enhance the capabilities of the conversation simulator and ensure high-quality conversational experiences. The training unit 224 is responsible for training the conversation simulator model using diverse datasets and techniques. This includes aggregating and preprocessing data from various sources, such as user profiles, historical interactions, and contextual information. The unit 224 chooses appropriate machine learning algorithms and architectures, such as neural networks, for training the conversation simulator model. The training unit employs reinforcement learning techniques, to optimize conversational strategies and responses. The unit 224 involves defining a reward system based on user engagement levels, satisfaction scores, and other performance metrics to guide learning. The training unit 224 facilitates continuous improvement of the conversation simulator through iterative learning processes. This includes incorporating user feedback and real-time data into the training process to iteratively refine the conversation simulator's performance, periodically evaluating the performance of the conversation simulator model using validation datasets and performance metrics, adjusting learning rates and update frequencies based on the rate of model convergence and performance improvements.

The payment unit 226 facilitates transactions within the system for the adaptive generation of conversational content, ensuring fair compensation for conversational content generation and customization services provided to the at least one query users. The payment unit 226 processes transactions related to the generation and customization of conversational content. This includes receiving payments from the at least one query users for services rendered, such as conversational content generation, customization, and dynamic adaptation during interactions, ensuring that payment processing adheres to industry-standard security protocols to protect sensitive financial information. The payment unit 226 determines the pricing model for different services offered within the system. This involves calculating the cost of content generation, customization, and other value-added services based on factors such as complexity, duration, and user preferences. The payment unit 226 provides the at least one query users with clear and transparent pricing information to facilitate informed decision-making, for subscription-based services. Further, the payment unit manages user subscriptions and recurring payments. This includes offering different subscription tiers with varying levels of access and features and handling recurring billing cycles and subscription renewals automatically to ensure uninterrupted service access for users. The payment unit 226 may offer incentives to encourage user engagement and retention. This involves implementing loyalty programs or reward systems where users earn incentives or discounts based on their usage or engagement levels, providing bonuses or discounts to users who refer new customers to the platform, thereby fostering user growth and community engagement, for platforms involving multiple stakeholders, such as content creators and platform operators, the payment unit manages revenue distribution. This includes distributing earnings to content creators based on usage metrics, revenue sharing agreements, or other contractual arrangements, deducting platform fees or commissions from transactions to cover operational costs and sustain the platform's viability. The unit 226 ensures the security of financial transactions and user data by implementing robust privacy and security measures. This includes encrypting payment information and communication channels to protect sensitive financial data from unauthorized access, adhering to relevant financial regulations and compliance standards to safeguard user privacy and prevent fraud.

The multi-modal interaction unit 228 facilitates seamless communication between users and the conversational system through various modalities such as text, voice, and visual inputs. The unit 228 ensures that users can engage with the system using their preferred mode of communication, thereby enhancing accessibility and user experience. The multi-modal interaction unit 228 supports allowing users to specify their preferred input and output modalities, such as text-only, voice-only video only or a combination of both. The unit 228 incorporates accessibility features to accommodate users with diverse needs and preferences. This includes supporting assistive technologies such as screen readers and voice commands to enable access for users with disabilities. The unit 228 designs intuitive and user-friendly interfaces that facilitate easy interaction across modalities for all users. This involves optimizing algorithms and infrastructure to handle concurrent processing of text, voice, and visual inputs efficiently.

In an exemplary operation, the application server 104 creates a personalized profile associated with the first user based on the received data by receiving data associated with a first user from a plurality of sources. In this embodiment the first user is a deceased user. In another embodiment, the data is provided by an input user and the input user is a living person associated with the first user. For example, the input user may be a living family member of the first/deceased user. In an embodiment, the data comprises image data, voice data, video data, social media posts, language preferences of the first user, and demographic data. In an embodiment, the plurality of sources comprises interviews, online social media, news sources, information from acquaintances associated with the user, personal diaries, and emails. For example, if Alex is a deceased user, then Alex's son, John, may provide data such as image data, voice data, video data, social media posts, emails, and the like of Alex to create a customized profile of Alex.

The application server 104 is configured to generate conversational content in real-time on behalf of the first user to enable interaction between at least one query users and a trained conversation simulator based on the personalized profile associated with each of the first user and the at least one query users. In an embodiment, the input user may also be a query user. The interaction between the at least one query users and the trained conversation simulator corresponds to at least one of emotional support, education, or entertainment. In an embodiment, the interaction is driven using a multi-modal interaction including text, voice, and visual inputs, enabling the at least one query users to engage with simulated conversations through their preferred mode of communication. The application server 104 is configured to generate the conversational content in real-time based on live events, news updates, or user context. In an embodiment, the conversational content is relevant and engaging in dynamic environments. In an embodiment, the first user is a deceased user, and the at least one query users are living.

The application server 104 is configured to provide the conversational content to the at least one query users during an interaction. In an embodiment, during the interaction, the at least one query users provides at least one input queries. In an embodiment, the input user may also be a query user. In response to interactions, the conversational unit is capable of generating rich multimedia responses, such as video clips, still images, or audio recordings, in addition to textual responses. This multi-modal capability enhances the depth of the interaction by offering a more immersive and dynamic experience for the query users. For instance, if a query user requests memories or past experiences associated with the first user, the trained conversation simulator can produce relevant images or videos from the first user's archives, providing a visually engaging narrative. Similarly, audio recordings, such as voice messages or music that the first user enjoyed, can be incorporated into the conversation to evoke emotional connections, and create a lifelike interaction.

The ability to integrate video, images, and audio as part of the conversational responses allows the trained conversation simulator to simulate a more natural and engaging dialogue. These media forms are generated or retrieved from pre-existing data associated with the first user, ensuring that they are personalized and contextually appropriate. The multimedia integration also enables the conversational system to better convey complex information, emotions, and nuances that may not be fully captured by text alone, thus offering query users a richer, more emotionally resonant experience during their interactions.

The application server 104 dynamically adapts the conversational content based on real-time feedback from the at least one query users and at least one interaction patterns within the interaction. In an embodiment, the dynamically adapted conversational content is personalized and provides an engaging interaction experience to the at least one query users during the interaction.

The application server 104 is configured to analyse the real-time feedback to identify user preferences associated with the at least one query users and engagement levels of the at least one query users. In an embodiment, the real-time feedback comprises biometric data, from the second user, heart rate, galvanic skin response, or facial expression analysis, to further personalize and adapt the conversational content based on the at least one query usersphysiological and emotional state.

The application server 104 is configured to anticipate at least one future interests and preferences of the at least one query users based on historical data and contextual cues using a predictive neural network artificial intelligence model. In an embodiment, the predictive neural network artificial intelligence model is configured for proactive conversation generation that aligns with the at least one query users evolving needs. In an embodiment, the predictive neural network artificial intelligence model is configured to identify patterns and trends indicative of the interests and preferences of the at least one query users over time and proactively generate conversational content aligned with at least one future interests and preferences of the second user, thereby adapting to the at least one query users evolving needs.

The application server 104 is configured to receive an input from the at least one query users, and the input is indicative of customizing at least one parameters of the conversations. In an embodiment, the at least one parameters comprises a tone, a pacing, or a depth of interaction. In an embodiment, the input corresponds to the individual preferences and emotional needs of the at least one query users. The application server 104 is configured to analyse the input from the at least one query users for emotional cues and generate at least one relevant responses in the conversational content to enhance empathy and rapport in the interaction. By evaluating the sentiment of the at least one query users input in real time and adjusting the tone and style of the conversational content the application server 104 is configured to maintain positive and supportive interaction. The application server 104 is configured to employ natural language understanding (NLU) and natural language generation (NLG) techniques to analyse and generate the conversational content in multiple languages to enable cross-linguistic and cross-cultural interactions between the at least one query users and the trained conversation simulator.

The application server 104 is configured to train the conversation simulator based on the received data and personalized profile associated with the first user. In an embodiment, the conversation simulator employs a reinforcement learning model that continuously improves its conversational strategies by receiving rewards based on the at least one query users' engagement levels and satisfaction scores. In an embodiment, the application server 104 uses federated learning techniques to train the conversation simulator across multiple devices and data sources without compromising the privacy of the at least one query users. In an embodiment, the personalized profile includes psychological and behavioural analysis of the at least one query users to allow the conversation simulator to tailor content based on personality traits, cognitive styles, and individual psychological needs.

In an embodiment, the application server 104 is configured to create a virtual representation of the first user based on the received data. The virtual representation of the first user is displayed to the at least one query users during the interaction. In an embodiment, the application server 104 is configured to integrate Extended Reality (XR) environments, including augmented reality (AR), virtual reality (VR), and Mixed Reality (MR) environments to provide the conversational content to the at least one query users. In an embodiment, the conversational content is presented in a 3D immersive experience, thereby enhancing the interaction by providing contextual visual and auditory stimuli aligned with the generated content. In an embodiment, the at least one query users may utilize a virtual head set to experience the VR. The application server 104 is configured to receive a payment from the at least one query users. In an embodiment, the payment is received for at least one generation or dynamic adaptation of the conversational content during the interaction.

FIG. 3 is a flowchart that illustrates a method 300 for adaptive generation of conversational content, in accordance with an embodiment of present disclosure. The method begins in a start step 302 and proceeds to step 304. At step 304, an application server receives data associated with a first user who is deceased from a plurality of sources. At step 306, an application server creates a personalized profile associated with the first user based on the received data. At step 308, an application server generates conversational content in real-time to enable interaction between at least one query users and a trained conversation simulator based on the personalized profile associated with the first user. At step 310, an application server provides the conversational content to the at least one query users during an interaction with the trained conversation simulator. In an embodiment, during the interaction, the at least one query users provide at least one input queries, and the trained conversation simulator generates the conversational content in real-time in response to the at least one input queries provided by the at least one query users. At step 312 an application server dynamically adapts the conversational content based on real-time feedback from the at least one query users and at least one interaction patterns within the interaction. The dynamically adapted conversational content is personalized and provides an engaging interaction experience. At step 314 an application server provides the dynamically adapted conversational content to the at least one query users during the interaction. Control passes end step 316.

FIG. 4 is a flowchart that illustrates a method 400 for adaptive generation of conversational content, in accordance with an embodiment of present invention. The method begins in a start step 402 and proceeds to step 404. At step 404, an application server is configured to receive an input from the at least one query users. The input is indicative of customizing at least one parameters of the conversations. The at least one parameters comprise a tone, a pacing, or a depth of interaction. The input corresponds to individual preferences and emotional needs of the at least one query users. At step 406, an application server is configured to analyse the input from the at least one query users for emotional cues and generate at least one relevant responses in the conversational content to enhance empathy and rapport in the interaction. At step 408, an application server is configured to evaluate the sentiment of the at least one query users input in real-time and adjusts the tone and style of the conversational content to maintain a positive and supportive interaction. At step 410, an application server is configured to employ natural language understanding (NLU) and natural language generation (NLG) techniques to analyze and generate the conversational content in multiple languages to enable cross-linguistic and cross-cultural interactions between the at least one query users and the trained conversation simulator. Control passes to end step 412.

In a working but non-limiting example of the aforementioned disclosure, let us consider a Scenario for Virtual Grief Counseling. A company provides virtual grief counselling services using the present disclosure. The system is designed to simulate conversations with deceased loved ones, providing emotional support and helping users process their grief through personalized and adaptive interactions. The system collects the following data on social media posts of the deceased user (John Doe): 200 Facebook posts, 500 Twitter tweets, 2,000 emails, 50 pages of diary entries, 20 hours of voice messages, and 500 images. In an embodiment, the data on social media posts of the deceased user (John Doe) may be provided by an input user such as a family member of John Doe. In an embodiment, the input user may also be a query user.

Now Biometric Data of at least one query users, Jane Smith, is collected and monitored. For example, the Heart rate is monitored using a wearable device (e.g., average 70 BPM, spikes to 90 BPM during emotional responses). Further, galvanic skin response is measured to detect stress levels and facial expressions are captured using a webcam and coded for sentiment analysis.

John Doe's (Deceased user) Profile: Based on the collected data, a comprehensive profile is created, capturing personality traits (e.g., extroverted, humorous), favorite topics (e.g., sports, music), and writing style (e.g., informal, emotive). Further, Jane Smith's (at least one query users) profile includes her emotional triggers, preferred conversation topics (e.g., memories with John), and communication style.

Now, the conversation simulator is trained using data from John Doe's profile, ensuring it can mimic his conversational style accurately. The simulator generates a greeting: "Hi Jane, it's John. I've been thinking about the time we went to that amazing concert. How have you been?" The system (trained conversation simulator) recognizes Jane's response and sentiment (e.g., "I miss you so much" with a sad tone). As Jane interacts, the simulator may adapt responses based on her real-time feedback and emotional state with a particular emphasis on providing validation of her feelings. If Jane's heart rate increases, indicating stress, the system may switch to a relaxation protocol and provide calming messages: "I know it's hard, Jane. Take a deep breath and remember the good times we had together." The system continuously monitors Jane's biometric data and facial expressions to adjust the conversation tone. Jane's facial expression shows a smile when recalling a happy memory, so the system follows up with another positive memory: "Remember that beach trip where we watched the sunset?" The predictive modelling unit uses historical data to predict future conversational topics predicts Jane might want to talk about, John's advice on life decisions, and generates proactive content: "Jane, remember how we always talked about following your dreams? What's the latest on your new project?" Jane customizes the interaction parameters via an app and the Tone sets to "reassuring" and the Pacing adjusts to "slow" to allow time for reflection. Further the Depth of the conversation chooses "details" to delve deeply into memories. The system adjusts responses to be more detailed and reassuring: "Jane, you're doing an amazing job. Remember when we tackled tough times together? You have that strength in you."

Further, the conversation simulator employs reinforcement learning, improving based on Jane's engagement. The Engagement Score tracks engagement (e.g., high when Jane responds quickly and positively) and the Reward System adjusts conversation strategies to maximize engagement scores over time. In an embodiment, a Subscription Model may exist in the system and Jane subscribes to the service, by paying a set fee per month. The system processes payments securely and provides access to personalized conversation sessions. The system provides multi-modal interaction utilizing Text, Voice, and Visuals. For example, Jane can interact using text on her smartphone, voice via a smart speaker, and visuals through a VR headset. Jane uses VR to "see" a virtual representation of John in a favorite place they visited, enhancing the emotional connection. The Engagement Score may simply be a measurement of second between a query and the second user's response, or it may be more complex and utilize data known of the second user to filter out or modify the score based upon impulsive or irrational comments.

Let us consider another detailed working example of the disclosure where the scenario is an Educational Interaction with Martin Luther King Jr. A company provides an educational service for school students, allowing them to engage in virtual conversations with a simulated version of Martin Luther King Jr. (MLK). The service uses the claimed invention to offer personalized, adaptive, and interactive learning experiences focusing on civil rights, history, and social justice. The Data collection unit collects data from various sources such as Historical speeches and writings (e.g., "I Have a Dream," "Letter from Birmingham Jail"), Biographies and historical records, Audio and video recordings of speeches, Social media content and public statements. The system collects data from the students (e.g., their interests, learning styles, and previous interactions), Learning preferences (e.g., visual, auditory), Performance data (e.g., grades in history and social studies), Engagement levels during past educational activities (e.g., participation in class discussions).

Based on the collected data, a comprehensive profile is created to capture his personality traits, rhetorical style, and key topics of interest. Detailed profiles are created for each student, including their educational background, learning preferences, and areas of interest. The conversation simulator is trained using MLK's historical data, ensuring it can accurately simulate his speech patterns and knowledge. The simulator initiates a conversation: "Hello, students. I am Dr. Martin Luther King Jr. Today, I'd like to talk to you about the importance of equality and justice. As students interact, the simulator adapts responses based on their real-time feedback and engagement levels. If students ask about the civil rights movement, the system provides detailed explanations and anecdotes from MLK's experiences. If a student shows interest in non-violent protest, the system elaborates on MLK's philosophy and methods. A Feedback Analysis Unit continuously monitors student reactions using facial recognition and engagement metrics and detects when students are confused or disengaged and adjusts the complexity of the content accordingly.

Example: If a student's facial expression shows confusion during a discussion on the "Letter from Birmingham Jail," the system simplifies the explanation and provides additional context. Predictive Modeling Unit uses historical and contextual data to predict and introduce relevant topics. Predicts students might be interested in MLK's views on contemporary social justice issues and thus generates proactive content: "In today's world, the fight for justice continues in many forms. Let's discuss how we can apply the principles of non-violence to current events." In an embodiment, the teachers can customize interaction parameters via an app and the Tone is set to educational and inspiring, the Pacing is adjusted to "moderate" to allow for in-depth discussion, and Depth is chosen as "detailed" to delve deeply into historical events and MLK's philosophy. The system adjusts responses to be more detailed and inspiring: "Remember, students, the power of love and non-violence can change the world. Let's explore how we can make a difference today." The conversation simulator employs reinforcement learning, improving based on student engagement. The system tracks engagement levels (e.g., high when students ask follow-up questions and participate actively). The reward system adjusts conversation strategies to maximize student engagement and learning outcomes over time.

The payment unit provides a subscription model for schools to subscribe to the service by paying an annual fee. The system processes payments securely and provides access to the virtual MLK interactions for the academic year. Multi-Modal Interaction Unit enables students to interact using text on classroom tablets, voice via classroom smart speakers, and visuals through interactive whiteboards. Example Interaction: Students use an interactive whiteboard to view a virtual representation of MLK delivering his "I Have a Dream" speech, enhancing the learning experience with immersive visuals and audio.

Various embodiments of the disclosure encompass numerous advantages including the system creates highly personalized profiles based on extensive data, including social media posts, biometric data, and personal communications. Present disclosure delivers conversational content tailored to individual preferences, emotional states, and contextual factors, resulting in more relevant and engaging interactions. One another advantage of the present disclosure is that system dynamically adapts conversational content based on real-time feedback and interaction patterns. Present disclosure ensures that interactions remain relevant and engaging throughout the conversation, enhancing user satisfaction and engagement. Present disclosure integrates text, voice, and visual inputs into a seamless and coherent interaction experience in this way present disclosure provides a versatile and accessible user experience, allowing users to interact using their preferred communication mode.

Scalable data processing utilizes distributed computing and advanced machine learning algorithms to process large volumes of data efficiently. Present disclosure enables real-time content generation and adaptation without latency or performance degradation, supporting high-demand environ-ments. Enhanced privacy and security employs federated learning and data anonymization techniques to protect user privacy. The disclosure allows models to be trained across multiple devices without centralizing sensitive data, reduc-ing the risk of data breaches and unauthorized access. Emotionally engaging interactions integrate sophisticated sentiment analysis and natural language understanding (NLU) to generate empathetic responses. This creates emo-tionally resonant conversations that enhance user engage-ment and emotional connection.

Users can use predictive neural network models to antici-pate future user needs and preferences. The present disclo-sure enables the proactive generation of relevant conversa-tional content, aligning with users' evolving interests and preferences. Monetization capabilities in the present disclo-sure incorporate a payment system for generating and dynamically adapting conversational content. The present disclosure also provides a viable business model for offering personalized conversational services, supporting the sustain-ability and growth of the system. Yet another advantage of the present disclosure is that the user gets an immersive interaction experience. The present disclosure enhances user engagement by providing contextual visual and auditory stimuli, making interactions more compelling and immer-sive.

The present disclosure involves a concrete and specific implementation of various technological components that collectively form an advanced system for generating adap-tive conversational content. The system uses tangible data sources, real-time processing, and integration of advanced machine learning models to achieve its objectives. These elements go beyond conventional means and embody prac-tical applications in technology, such as data collection unit aggregates real data from multiple sources including bio-metric sensors, social media, and personal communications, which are tangible and measurable. Profile creation unit creates detailed user profiles using psychological and behav-ioral analysis, resulting in specific and actionable data points that inform the conversation simulator. Conversation simu-lator unit employs advanced NLU and NLG techniques, leveraging concrete algorithms and computational processes to generate conversational content in real-time. Real-Time interaction unit processes and responds to user inputs dynamically, requiring real-time computational operations and data handling. Predictive modeling unit utilizes predic-tive neural networks to analyze historical and contextual data, generating specific, anticipatory conversational con-tent. These units and their interactions are implemented using specific techniques, data structures, and processing techniques that provide a technical solution to the problem of adaptive and contextual conversational content genera-tion.

The present disclosure represents a unique combination and application of several advanced techniques and tech-nologies. The specific integration and interplay of these elements demonstrate a level of innovation that goes beyond what is obvious to a person skilled in the art. The use of reinforcement learning and predictive neural networks for real-time adaptation and proactive content generation is an innovative application of these models in the context of conversational AI. Multi-modal interaction integrating text, voice, and visual inputs within a single coherent system, and further enhancing this with XR environments, represents a significant technical advancement in user interaction design. Real-Time feedback and adaptation the dynamic adaptation of conversational content based on real-time biometric feed-back and interaction patterns involves sophisticated real-time data processing and analysis that are not trivial or obvious. Federated learning for privacy implementing fed-erated learning techniques to train models across multiple devices while ensuring privacy is a complex approach to enhancing data security and model training efficiency.

A person with ordinary skills in the art will appreciate that the systems, modules, and sub-modules have been illustrated and explained to serve as examples and should not be considered limiting in any manner. It will be further appre-ciated that the variants of the above disclosed system elements, modules, and other features and functions, or alternatives thereof, may be combined to create other dif-ferent systems or applications.

Those skilled in the art will appreciate that any of the aforementioned steps and/or system modules may be suit-ably replaced, reordered, or removed, and additional steps and/or system modules may be inserted, depending on the needs of a particular application. In addition, the systems of the aforementioned embodiments may be implemented using a wide variety of suitable processes and system modules, and are not limited to any particular computer hardware, software, middleware, firmware, microcode, and the like. The claims can encompass embodiments for hard-ware and software, or a combination thereof.

It is to be understood that psychology is a complex science and is continually being updated as it continues to develop. Therefore, it is impossible to recite any specific methodologies, models, strategies, or theories that could guide the Artificial Intelligence in its particular responses to a second user. Therefore, this Specification should be read to include any means of quantifying a person's psyche, whether used in the past, present, or future, in an acceptable manner for analysis and machine learning, and also include any guiding principals or modes of therapy and analysis in determining responses given by the AI.

While the present disclosure has been described with reference to certain embodiments, it will be understood by those skilled in the art that various changes may be made and equivalents may be substituted without departing from the scope of the present disclosure. In addition, many modifi-cations may be made to adapt a particular situation or material to the teachings of the present disclosure without departing from its scope. Therefore, it is intended that the present disclosure is not limited to the particular embodi-ment disclosed, but that the present disclosure will include all embodiments falling within the scope of the appended claims.

What is claimed is:

1. A method for adaptive generation of conversational content, the method comprising:

receiving, by an application server, data associated with a first user from a plurality of sources, wherein the data is provided by an input user, wherein the input user is an entity selected from the set of entities consisting of a living person associated with the first user and the first user themselves;

creating, by the application server, a personalized profile associated with the first user based on the received data;

training a conversation simulator based on the received data and personalized profile associated with the first user, and wherein the conversation simulator employs a reinforcement learning model that continuously improves its conversational strategies by receiving rewards based on the at least one query users engagement levels and satisfaction scores, wherein the application server uses federated learning techniques to train the conversation simulator across multiple devices and data sources without compromising privacy of the at least one query users, and wherein the personalized profile includes psychological and behavioral analysis of the first user for allowing the conversation simulator to tailor content based on personality traits, cognitive styles, and individual psychological needs;

generating, by the application server, conversational content in real-time to enable interaction between at least one query users and the trained conversation simulator based on the personalized profile associated with the first user;

providing, by the application server, the conversational content to the at least one query users during an interaction with the trained conversation simulator, wherein during the interaction, the at least one query users provide at least one input queries, and the trained conversation simulator generates the conversational content in real-time in response to the at least one input queries provided by the at least one query users;

analyzing real-time feedback to identify user preferences associated with the at least one query users and engagement levels of the at least one query users, wherein the real-time feedback is selected from the feedback types consisting of biometric data from the at least one query users to further personalize and adapt the conversational content based on the at least one query users physiological and emotional state, said biometric data being selected from the set of biometric data consisting of: heart rate, galvanic skin response, stress levels, and facial expression analysis;

dynamically adapting, by the application server, the conversational content based on the real-time feedback from the at least one query users and from at least one interaction patterns within the interaction, wherein the dynamically adapted conversational content is personalized and provides an engaging interaction experience; and providing, by the application server, the dynamically adapted conversational content to the at least one query users during the interaction.

2. The method for adaptive generation of conversational content of claim 1, wherein generating the conversational content in real-time is based on at least one of: live events, news updates, and user context, wherein the conversational content is relevant and engaging in dynamic environments.

3. The method for adaptive generation of conversational content of claim 1, further comprising:

anticipating at least one future interests and preferences of the at least one query users based on historical data and contextual cues using a predictive neural network model, wherein the predictive neural network model is configured for proactive conversation generation that aligns with the at least one query users evolving needs and is configured to identify patterns and trends indicative of interests and preferences of the at least one query users over time, and proactively generating conversational content aligned with the at least one future interests and preferences of the at least one query users, thereby adapting to the at least one query users evolving needs.

4. The method for adaptive generation of conversational content of claim 1, further comprising:

receiving an input from the at least one query users, wherein the input is indicative of customizing at least one parameters of the conversations, wherein the input corresponds to individual preferences and emotional needs of the at least one query users and the at least one parameters is selected form the set of parameters consisting of: a tone, a pacing, and a depth of interaction;

analyzing the input from the at least one query users for emotional cues and generating at least one relevant responses in the conversational content to enhance empathy and rapport in the interaction;

evaluating sentiment of the at least one query users input in real-time and adjusting the tone and style of the conversational content to maintain a positive and supportive interaction; and, employing natural language understanding (NLU) and natural language generation (NLG) techniques to analyze and generate the conversational content in multiple languages to enable cross-linguistic and cross-cultural interactions between the at least one query users and the trained conversation simulator.

5. The method for adaptive generation of conversational content of claim 1, further comprising receiving a payment from the at least one query users.

6. The method for adaptive generation of conversational content of claim 1, wherein the data is selected form the set of data consisting of: image data, voice data, video data, social media posts, language preferences of the first user, demographic data, and wherein the plurality of sources comprises sources selected from the set of sources consisting of: interviews, online social media, news sources, information from acquaintances associated with the user, personal diaries, and emails.

7. The method for adaptive generation of conversational content of claim 1, wherein the first user is a deceased user and the at least one query users are living user, wherein the interaction between the at least one query users and the interaction is driven using a multi-modal interaction including text, voice, and visual inputs, enabling the at least one query users to engage with simulated conversations through their preferred mode of communication.

8. The method for adaptive generation of conversational content of claim 1, further comprising:

creating a virtual representation of the first user based on the received data, wherein the virtual representation of the first user is displayed to the at least one query users during the interaction, and, integrating Extended Reality (XR) environments, wherein the conversational content is presented in a 3D immersive experience, thereby enhancing the interaction by providing contextual visual and auditory stimuli aligned with the generated content.

9. A system to adaptively generate conversational content, the system comprising:

a processor;

a memory, communicatively coupled with the processor, wherein the memory stores processor-executable instructions, which on execution cause the processor to:

receive data associated with a first user from a plurality of sources, wherein the data is provided by an input user, wherein the input user is an entity selected from the set of entities consisting of a living person associated with the first user and the first user themselves;

create a personalized profile associated with the first user based on the received data;

train a conversation simulator based on the received data and personalized profile associated with the first user, and wherein the conversation simulator employs a reinforcement learning model that continuously improves its conversational strategies by receiving rewards based on the at least one query users engagement levels and satisfaction scores, wherein the application server uses federated learning techniques to train the conversation simulator across multiple devices and data sources without compromising privacy of the at least one query users, and wherein the personalized profile includes psychological and behavioral analysis of the first user for allowing the conversation simulator to tailor content based on personality traits, cognitive styles, and individual psychological needs;

generate conversational content in real-time to enable interaction between the at least one query users and a trained conversation simulator based on the personalized profile associated with the first user;

provide the conversational content to the at least one query users during an interaction with the trained conversation simulator, wherein during the interaction, the at least one query users provides at least one input queries, and the trained conversation simulator generates the conversational content in real-time in response to the at least one input queries provided by the at least one query users;

analyze real-time feedback to identify user preferences associated with the at least one query users and engagement levels of the at least one query users, wherein the real-time feedback is selected from the feedback types consisting of biometric data from the at least one query users to further personalize and adapt the conversational content based on the at least one query users physiological and emotional state, said biometric data being selected from the set of biometric data consisting of: heart rate, galvanic skin response, stress levels, and facial expression analysis;

dynamically adapt the conversational content based on the real-time feedback from the at least one query users and at from least one interaction patterns within the interaction, wherein the dynamically adapted conversational content is personalized and provides an engaging interaction experience; and provide the dynamically adapted conversational content to the at least one query users during the interaction.

10. The system to adaptively generate conversational content of claim 9, wherein the processor is configured to generate the conversational content in real-time is based on at least one of: live events, news updates, and user context, wherein the conversational content is relevant and engaging in dynamic environments.

11. The system to adaptively generate conversational content of claim 9, wherein the processor is configured to:

anticipate at least one future interests and preferences of the at least one query users based on historical data and contextual cues using a predictive neural network model, wherein the predictive neural network model is configured for proactive conversation generation that aligns with the at least one query users evolving needs, and is configured to identify patterns and trends indicative of interests and preferences of the at least one query users over time, and proactively generate conversational content aligned with the at least one future interests and preferences of the at least one query users, thereby adapting to the at least one query users evolving needs.

12. The system to adaptively generate conversational content of claim 9, wherein the processor is configured to:

receive an input from the at least one query users, wherein the input is indicative of customizing at least one parameters of the conversations, wherein the input corresponds to individual preferences and emotional needs of the at least one query users and the at least one parameters is selected form the set of parameters consisting of: a tone, a pacing, and a depth of interaction;

analyze the input from the at least one query users for emotional cues and generating at least one relevant responses in the conversational content to enhance empathy and rapport in the interaction, evaluate sentiment of the second user's input in real-time and adjusting the tone and style of the conversational content to maintain a positive and supportive interaction; and employ natural language understanding (NLU) and natural language generation (NLG) techniques to analyze and generate the conversational content in multiple languages to enable cross-linguistic and cross-cultural interactions between the at least one query users and the trained conversation simulator.

13. The system to adaptively generate conversational content of claim 9, wherein the processor is configured to receive a payment from the at least one query users.

14. The system to adaptively generate conversational content of claim 9 wherein the data is selected form the set of data consisting of: image data, voice data, video data, social media posts, language preferences of the first user, demographic data, and wherein the plurality of sources comprises sources selected from the set of sources consisting of: interviews, online social media, news sources, information from acquaintances associated with the user, personal diaries, and emails.

15. The system to adaptively generate conversational content of claim 9, wherein the first user is a deceased user and the at least one query users are living users, wherein the interaction between the at least one query users and the interaction is driven using a multi-modal interaction including text, voice, and visual inputs, enabling the at least one query users to engage with simulated conversations through their preferred mode of communication.

16. The system to adaptively generate conversational content of claim 9, wherein the processor is configured to:

create a virtual representation of the first user based on the received data, wherein the virtual representation of the first user is displayed to at least one query users during the interaction; and integrate Extended Reality (XR) environments, wherein the conversational content is presented in a 3D immersive experience, thereby enhancing the interaction by providing contextual visual and auditory stimuli aligned with the generated content.

\* \* \* \* \*